US011134582B2

(12) United States Patent
Chen et al.

(10) Patent No.: US 11,134,582 B2
(45) Date of Patent: Sep. 28, 2021

(54) CABLE MANAGEMENT ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 43 days.

(21) Appl. No.: 16/698,040

(22) Filed: Nov. 27, 2019

(65) Prior Publication Data
US 2020/0413562 A1    Dec. 31, 2020

(30) Foreign Application Priority Data

Jun. 25, 2019   (TW) .................................. 108122506

(51) Int. Cl.
*H05K 7/00*     (2006.01)
*H05K 7/14*     (2006.01)
(52) U.S. Cl.
CPC ......... *H05K 7/1491* (2013.01); *H05K 7/1489* (2013.01)
(58) Field of Classification Search
None
See application file for complete search history.

(56) References Cited

U.S. PATENT DOCUMENTS

| 8,379,410 | B2 | 2/2013 | Kitten |
| 9,072,190 | B2 | 6/2015 | Chen et al. |
| 9,167,717 | B2 | 10/2015 | Chen et al. |
| 9,451,729 | B2 | 9/2016 | Bailey |
| 9,640,961 | B2 | 5/2017 | Chen et al. |
| 10,292,301 | B1* | 5/2019 | Chen .................... H05K 7/1491 |
| 10,356,932 | B2 | 7/2019 | Chen et al. |

(Continued)

FOREIGN PATENT DOCUMENTS

| EP | 3030065 A1 | 6/2016 |
| EP | 3442316 A1 | 2/2019 |
| JP | 3183956 U | 6/2013 |

*Primary Examiner* — Steven M Marsh
(74) *Attorney, Agent, or Firm* — Alan D. Kamrath; Karin L. Williams; Mayer & Williams PC

(57) ABSTRACT

A cable management assembly includes a first cable management arm, a second cable management arm, a supporting frame and a connecting device. One of the first cable management arm, the second cable management arm and the supporting frame is arranged with the connecting device. The connecting device includes a base, an engaging member and an operating member. The engaging member has an engaging part located adjacent to a first end of the base. The operating member has an operating part and a guiding part. The operating part is located adjacent to a second end of the base. The operating member is configured to be operated through the operating part to move, and the guiding part is configured to guide the engaging part in response to movement of the operating member in order to move the engaging part of the engaging member away from an engaging position.

20 Claims, 9 Drawing Sheets

(56) References Cited

U.S. PATENT DOCUMENTS

| | | | |
|---|---|---|---|
| 2014/0158646 A1* | 6/2014 | Chen | H05K 7/1491 |
| | | | 211/26 |
| 2016/0161026 A1* | 6/2016 | Chen | H05K 7/1491 |
| | | | 248/70 |
| 2016/0215904 A1* | 7/2016 | Chen | H02G 3/32 |
| 2019/0053396 A1* | 2/2019 | Chen | H05K 7/1491 |
| 2020/0060040 A1* | 2/2020 | Chen | H02G 11/00 |

* cited by examiner

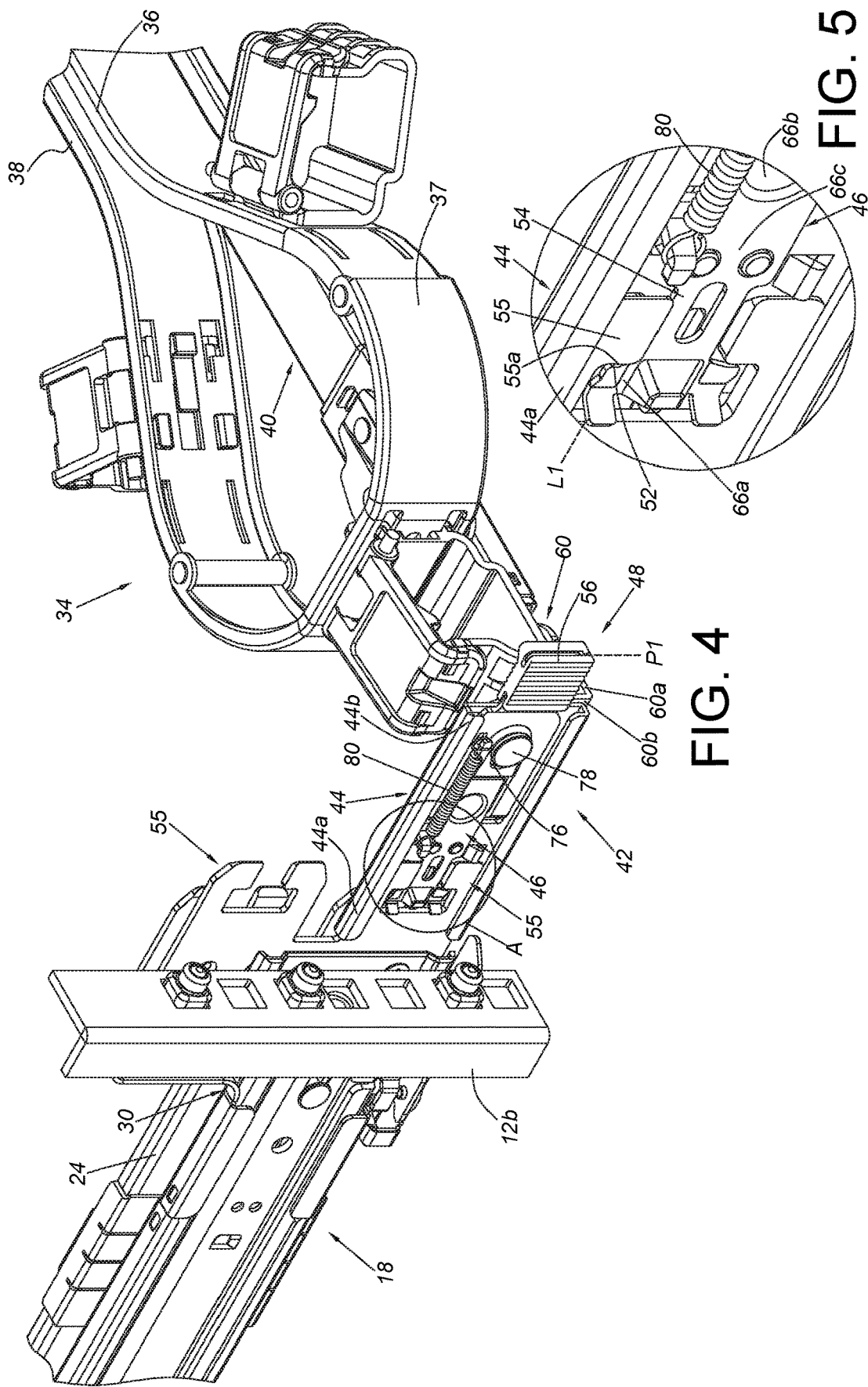

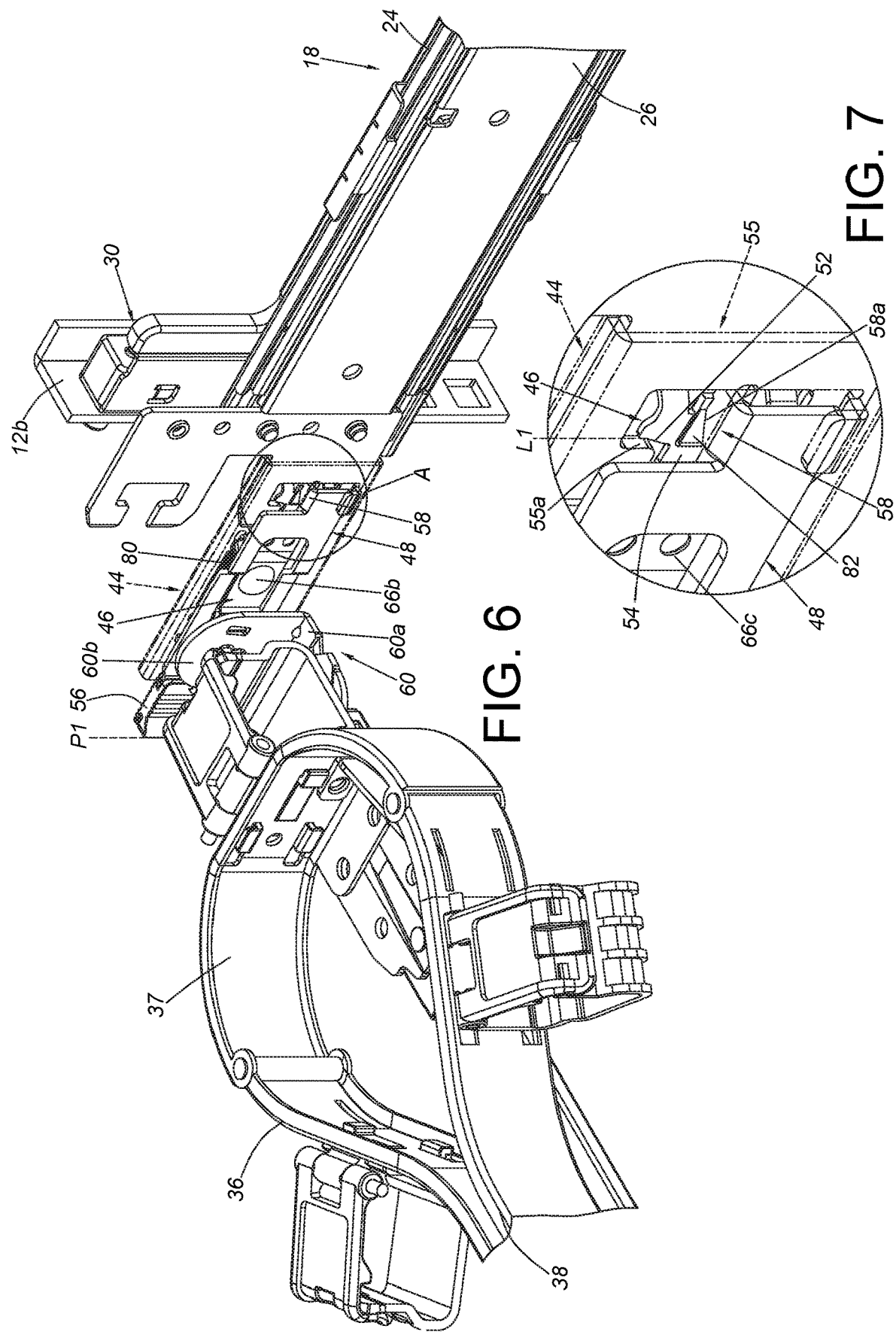

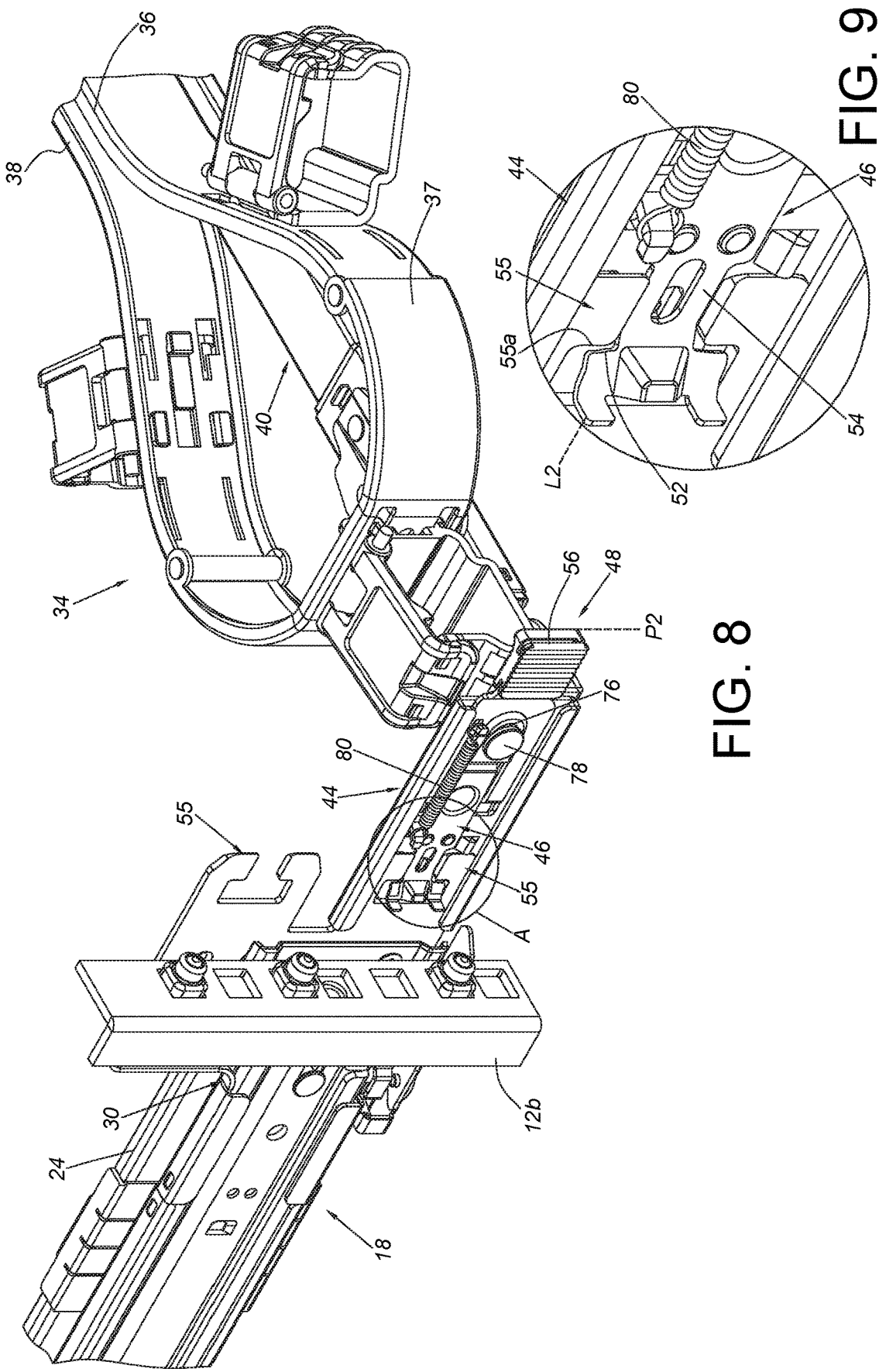

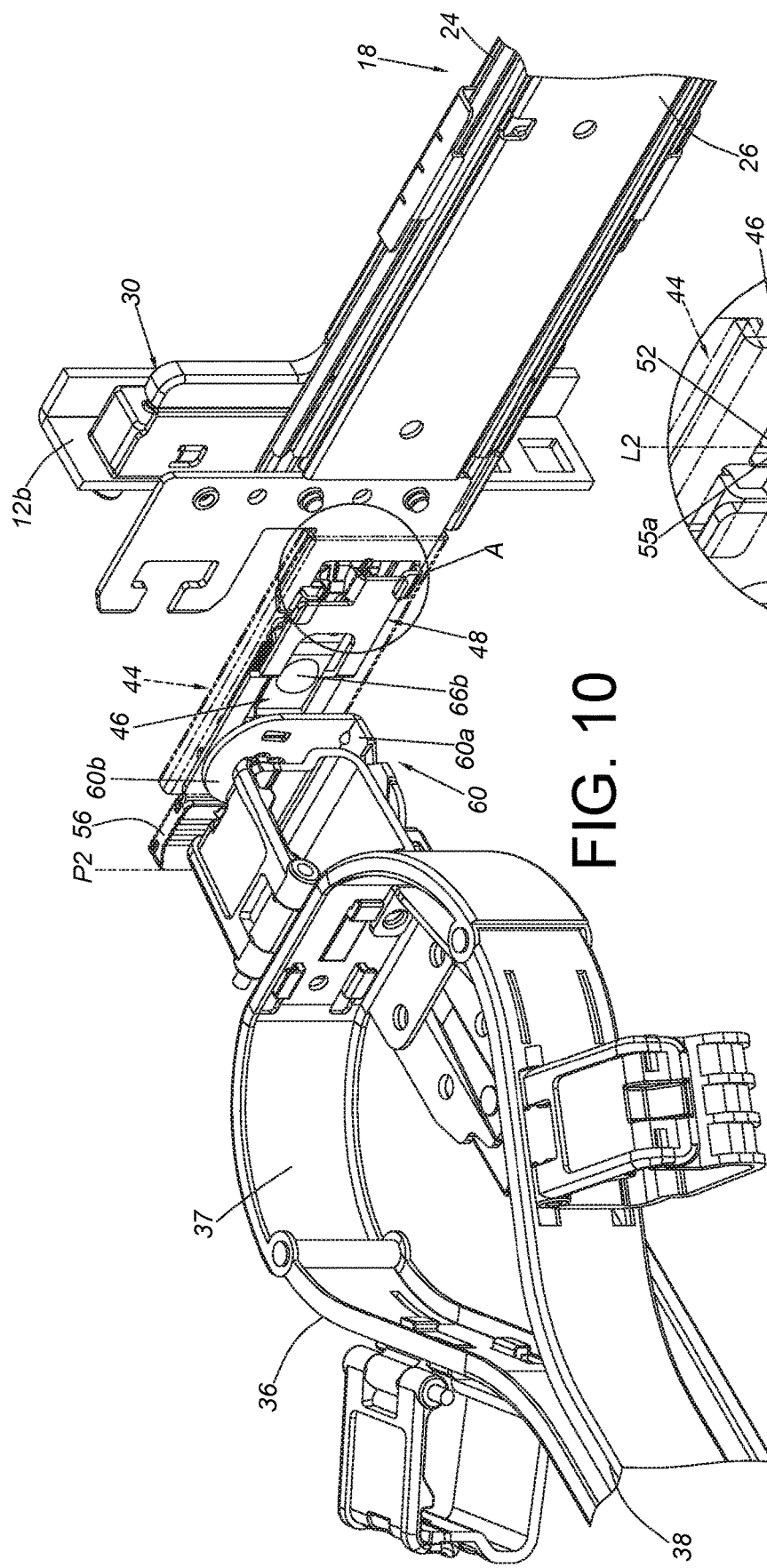
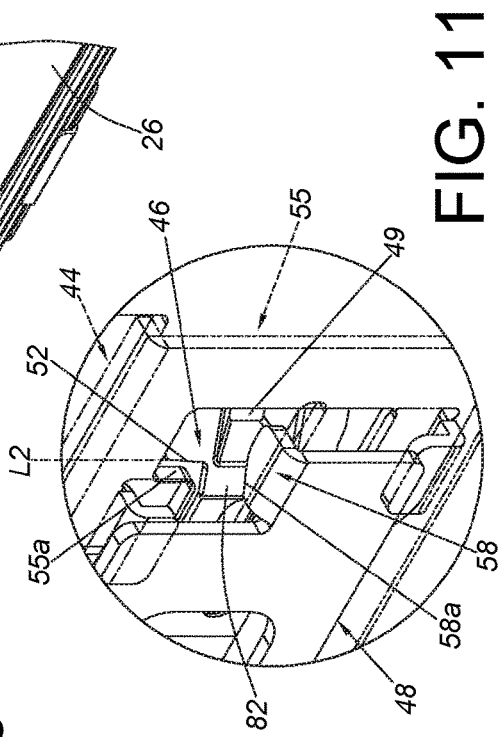

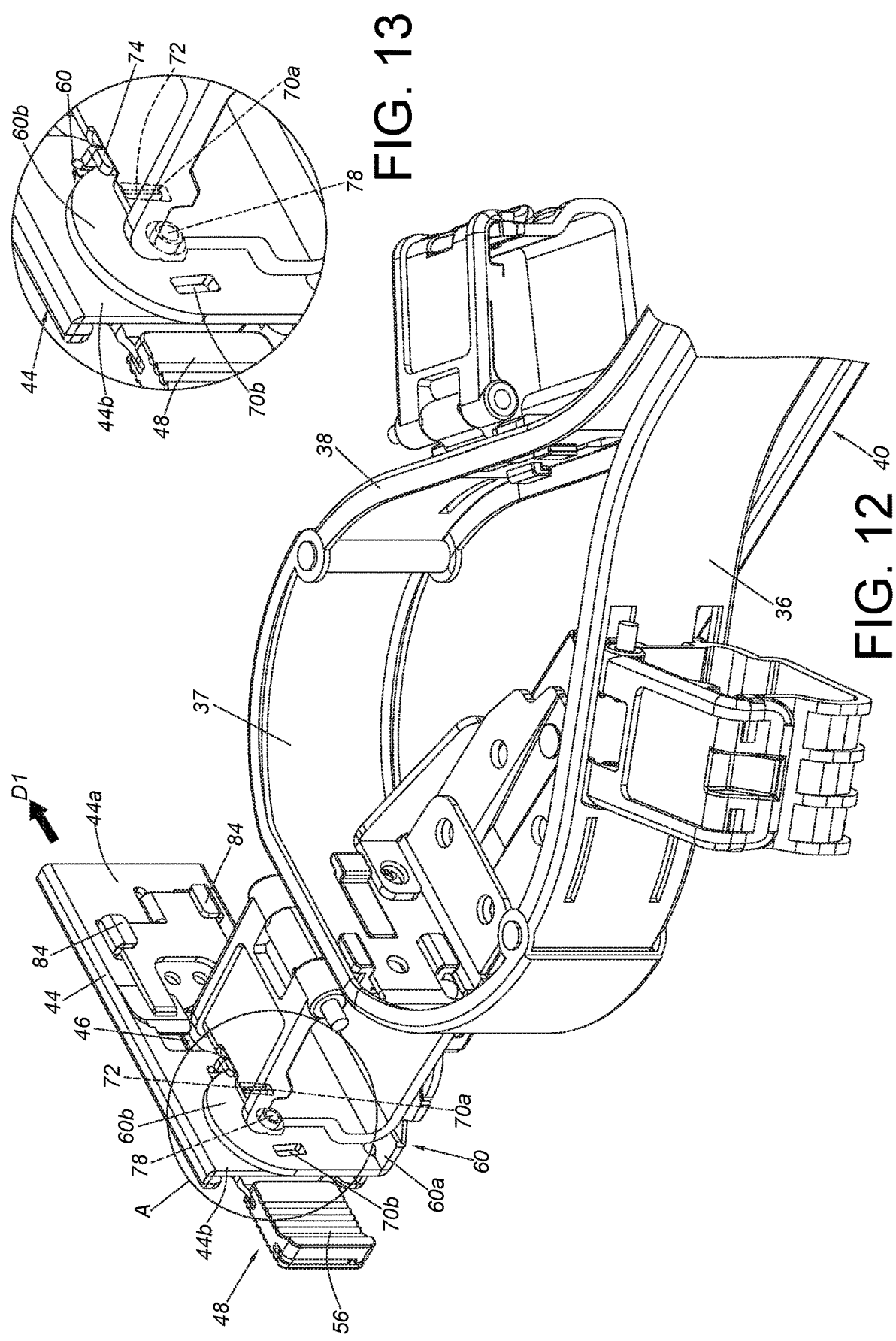

CABLE MANAGEMENT ASSEMBLY

BACKGROUND OF THE INVENTION

1. Field of the Invention

The present invention relates to a cable management assembly, and more particularly, to an easy-to-operate cable management assembly for supporting cables.

2. Description of the Prior Art

U.S. Pat. Nos. 9,072,190 B2 and 9,640,961 B2 of Chen et al. disclose a cable management assembly comprising a pair of cable management arms and a supporting rod configured to support the pair of cable management arms. U.S. Pat. No. 9,167,717 B2 of Chen et al. discloses that end portions of the pair of cable management arms can be detached from a slide rail kit by pressing a two-way button transversely.

According to U.S. Pat. No. 8,379,410 B2 of Kitten and U.S. Pat. No. 9,451,729 B2 of Bailey, the cable management assembly is configured to manage cables of an electronic device in a cabinet. However, if the cabinet has a side plate and the cable management assembly is required to be detached from the slide rail kit, it is not easy to press transversely within a limited operation space due to obstruction of the cables and/or the side plate of the cabinet. Accordingly, it is important to develop a different cable management assembly.

SUMMARY OF THE INVENTION

The present invention relates to an easy-to-operate cable management assembly capable of being easily detached from a slide rail kit.

According to an embodiment of the present invention, a cable management assembly comprises a first cable management arm, a second cable management arm, a supporting frame and a connecting device. The second cable management arm is movably connected to the first cable management arm. The supporting frame is configured to support at least one of the first cable management arm and the second cable management arm. The connecting device is arranged on the supporting frame. The connecting device comprises a base, an engaging member and an operating member. The base has a longitudinal body. The longitudinal body has a first end and a second end. The engaging member has an engaging part and an elastic part. The engaging part is located adjacent to the first end of the base, and the engaging part is located at an engaging position in response to an elastic force of the elastic part. The operating member has an operating part and a guiding part. The operating part is located adjacent to the second end of the base. The operating member is configured to be operated through the operating part to move from a first position to a second position. The guiding part is configured to guide the engaging member in response to movement of the operating member, in order to move the engaging part of the engaging member away from the engaging position.

Preferably, the cable management assembly further comprises a supporting member having a first part and a second part substantially perpendicularly connected to the first part. The supporting frame is connected to the first part of the supporting member. The base of the connecting device is connected to the second part of the supporting member.

Preferably, the engaging member further comprises a first engaging section, a second engaging section and a middle part connected between the first engaging section and the second engaging section. The engaging part is arranged on the first engaging section. The elastic part is connected between the engaging part and the middle part. The middle part is connected to the base of the connecting device. The base of the connecting device has an opening corresponding to the second engaging section of the engaging member.

Preferably, the second part of the supporting member comprises a first positioning feature and a second positioning feature. The second engaging section of the engaging member has a fastening part configured to be selectively engaged with one of the first positioning feature and the second positioning feature, in order to allow the first end of the base of the connecting device to extend in a first direction or a second direction opposite to the first direction.

Preferably, the base of the connecting device has a first abutting part configured to abut against an edge of the second part of the supporting member.

Preferably, one of the base and the operating member of the connecting device is arranged with a longitudinal hole configured to allow a portion of a shaft member to pass through in order to connect the operating member to the base of the connecting device, such that the operating member is movable relative to the base of the connecting device within a limited range.

Preferably, the base of the connecting device has a second abutting part corresponding to the operating member.

Preferably, the cable management assembly further comprises an elastic member configured to provide an elastic force to the operating member, in order to drive the operating member to return to the first position.

Preferably, one of the guiding part and the engaging member has a protruded structure formed with an arc surface or an inclined surface, and the other one of the guiding part and the engaging member has a recessed part extended with an abutting surface. When the guiding part is moved in response to the operating member, the protruded structure is moved away from the recessed part to abut against the abutting surface in order to move the engaging part of the engaging member away from the engaging position.

Preferably, the operating part of the operating member is extended beyond the second end of the base of the connecting device.

According to another embodiment of the present invention, a cable management assembly of a slide rail kit comprises a first slide rail assembly and a second slide rail assembly. The first slide rail assembly comprises a first rail and a second rail movable relative to the first rail. The second slide rail assembly comprises a third rail and a fourth rail movable relative to the third rail. The third rail is arranged with a connecting member. The cable management assembly comprises a first cable management arm, a second cable management arm, a supporting frame and a connecting device. The first cable management arm is detachably connected to the first rail of the first slide rail assembly. The second cable management arm is movably connected to the first cable management arm. The second cable management arm is detachably connected to the second rail of the first slide rail assembly. The supporting frame is configured to support at least one of the first cable management arm and the second cable management arm. The connecting device is arranged on the supporting frame. The supporting frame is detachably connected to the third rail of the second slide rail assembly through the connecting device. The connecting device comprises a base, an engaging member and an operating member. The base has a longitudinal body. The longitudinal body has a first end and a second end. The engaging member has an engaging part. The engaging part is located adjacent to the first end of the base. The engaging part of the engaging member is configured to be engaged with the connecting member of the third rail when the engaging part of the engaging member is located at an engaging position. The operating member has an operating part and a guiding part. The operating part is located adjacent to the second end of the base. The operating member is configured to be operated through the operating part to move from a first position to a second position. The guiding part is configured to guide the engaging member in response to movement of the operating member, in order to move the engaging part of the engaging member away from the engaging position to detach the supporting frame from the third rail.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram in a first viewing angle showing the supporting frame of the cable management assembly being connected to the slide rail through the connecting device with an operating member being located at a first position according to an embodiment of the present invention;

FIG. 5 is an enlarged view of an area A of FIG. 4;

FIG. 6 is a diagram in a second viewing angle showing the supporting frame of the cable management assembly being connected to the slide rail through the connecting device according to an embodiment of the present invention;

FIG. 7 is an enlarged view of an area A of FIG. 6;

FIG. 8 is a diagram in the first viewing angle showing the supporting frame of the cable management assembly being connected to the slide rail through the connecting device with the operating member being operated to move to a second position according to an embodiment of the present invention;

FIG. 9 is an enlarged view of an area A of FIG. 8;

FIG. 10 is a diagram in the second viewing angle showing the supporting frame of the cable management assembly being connected to the slide rail through the connecting device with the operating member being operated to move to the second position according to an embodiment of the present invention;

FIG. 11 is an enlarged view of an area A of FIG. 10;

FIG. 12 is a diagram showing a base of the connecting device of the cable management assembly being in one state according to an embodiment of the present invention;

FIG. 13 is an enlarged view of an area A of FIG. 12; and

DETAILED DESCRIPTION

Figure 1:
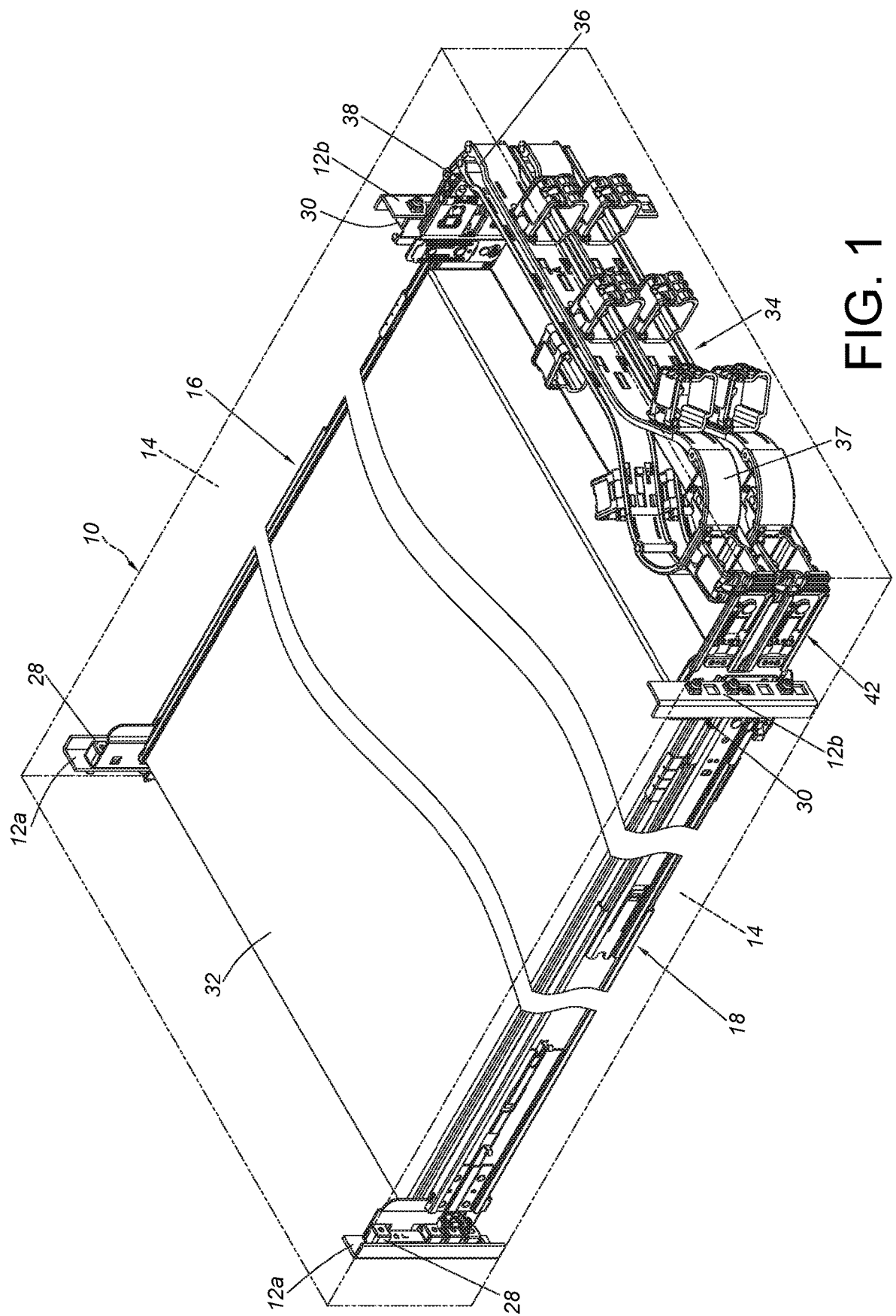
FIG. 1 is a diagram showing a cable management assembly in a first state being applied to a cabinet according to an embodiment of the present invention.

FIG. 1 is a diagram showing a cabinet 10 comprising a plurality of posts, such as a pair of front posts 12a and a pair of rear posts 12b. The cabinet 10 is usually arranged with a plurality of wall plates. For example, the cabinet 10 is arranged with side plates 14 at two lateral sides. In addition, the cabinet 10 is arranged with openable door plates at front and rear sides. In the present embodiment, the door plates are detached from the cabinet 10, such that the cabinet 10 is in an open state. Furthermore, the cabinet 10 can be arranged with a plurality of slide rail kits inside. In the present embodiment, the cabinet 10 is arranged with one slide rail kit which comprises a first slide rail assembly 16 and a second slide rail assembly 18.

Figure 2:
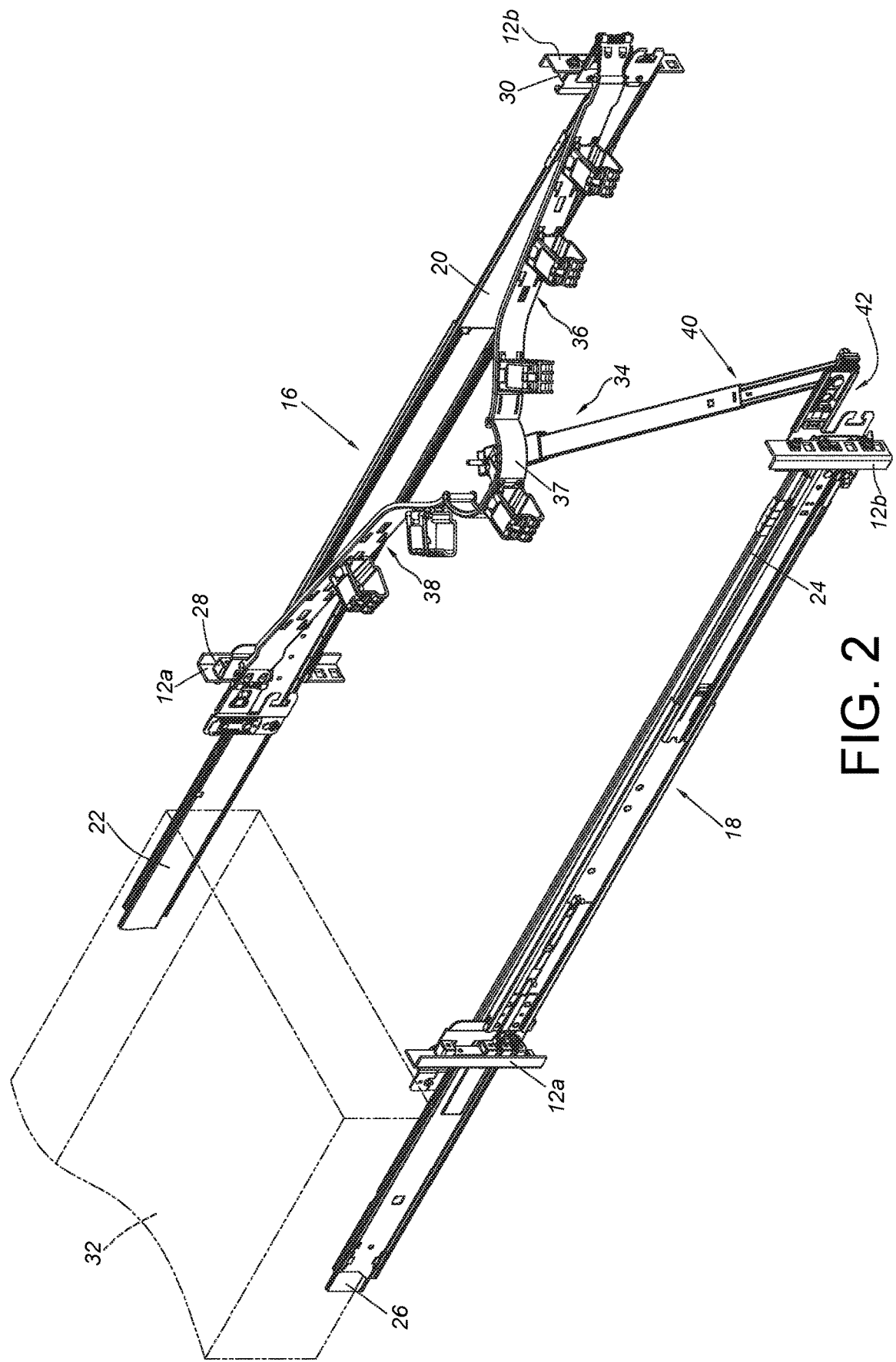
FIG. 2 is a diagram showing the cable management assembly in a second state being applied to the cabinet according to an embodiment of the present invention.

As shown in FIG. 2, the first slide rail assembly 16 comprises a first rail 20 and a second rail 22 longitudinally movable relative to the first rail 20. The second slide rail assembly 18 comprises a third rail 24 and a fourth rail 26 longitudinally movable relative to the third rail 24. The first slide rail assembly 16 and the second slide rail assembly 18 are correspondingly arranged inside the cabinet 10 at two lateral sides. For example, the first rail 20 of the first slide rail assembly 16 is mounted to the front post 12a and the rear post 12b through a front bracket 28 and a rear bracket 30 respectively. The second rail 22 is longitudinally movable relative to the first rail 20, and the second rail 22 is configured to carry a carried object 32, such as an electronic device, a drawer or the like. In the present embodiment, the second rail 22 is configured to carry an electronic device. The carried object 32 can be pushed into the cabinet 10 with assistance of the second rail 22. On the other hand, the second slide rail assembly 18 has a substantially identical structure as the first slide rail assembly 16. Therefore, no further illustration is provided. In order to manage cables behind the carried object 32, a cable management assembly 34 is arranged behind the carried object 32.

The cable management assembly 34 comprises a first cable management arm 36, a second cable management arm 38, a supporting frame 40 and a connecting device 42. The first cable management arm 36 is detachably connected to the first rail 20 of the first slide rail assembly 16. The second cable management arm 38 is movably connected to the first cable management arm 36. For example, the second cable management arm 38 is pivotally connected to the first cable management arm 36 through a pivoting base 37, and the second cable management arm 38 is detachably connected to the second rail 22 of the first slide rail assembly 16. The supporting frame 40 is configured to support at least one of bottoms of the first cable management arm 36 and the second cable management arm 38. The connecting device 42 is arranged on the supporting frame 40. The supporting frame 40 is detachably connected to the third rail 24 of the second slide rail assembly 18 through the connecting device 42.

As shown in FIG. 3 to FIG. 7, the connecting device 42 comprises a base 44, an engaging member 46 and an operating member 48.

The base 44 has a longitudinal body. The longitudinal body has a first end 44a and a second end 44b.

The engaging member 46 has an engaging part 52 and an elastic part 54. The engaging part 52 is located adjacent to the first end 44a of the base 44. The engaging part 52 is configured to be engaged with a connecting member 55 of the third rail 24. Preferably, the connecting member 55 has a C-shaped contour and is arranged with a pair of connecting sections 55a. Specifically, the engaging part 52 is configured to be located at an engaging position L1 in response to an elastic force of the elastic part 54, and the engaging part 52 is configured to be engaged with the connecting sections 55a of the connecting member 55 (as shown in FIG. 5 and FIG. 7).

The operating member 48 has an operating part 56 and a guiding part 58. The operating part 56 is located adjacent to the second end 44b of the base 44. The guiding part 58 corresponds to the engaging member 46.

Figure 3:
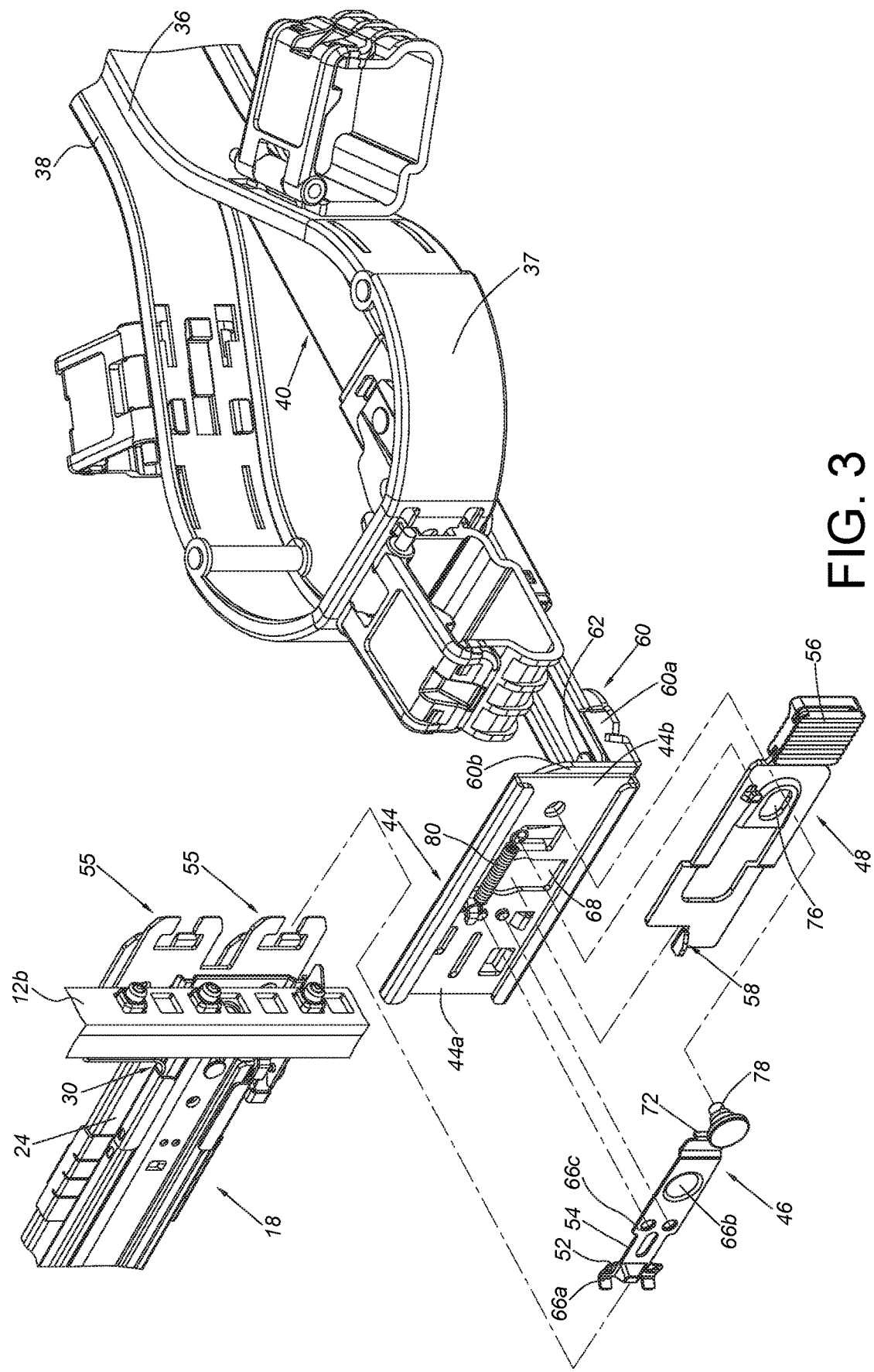
FIG. 3 is an exploded view of a connecting device configured to connect a supporting frame of the cable management assembly to a slide rail according to an embodiment of the present invention.

Preferably, the cable management assembly 34 further comprises a supporting member 60 having a first part 60a and a second part 60b substantially perpendicularly connected to the first part 60a. The supporting frame 40 is connected to the first part 60a of the supporting member 60. For example, an end part of the supporting frame 40 is pivotally connected to the first part 60a of the supporting member 60 through a connecting shaft 62 (as shown in FIG. 3), such that the supporting frame 40 is pivoted relative to the supporting member 60. On the other hand, the base 44 of the connecting device 42 is connected (such as pivotally connected) to the second part 60b of the supporting member 60, such that the base 44 of the connecting device 42 is pivoted relative to the supporting member 60.

Preferably, the engaging member 46 comprises a first engaging section 66a, a second engaging section 66b and a middle part 66c connected between the first engaging section 66a and the second engaging section 66b. The engaging part 52 is arranged on the first engaging section 66a (please refer to FIG. 5). The elastic part 54 is connected between the engaging part 52 and the middle part 66c. The middle part 66c is connected (such as fixedly connected) to the base 44, and the base 44 has an opening 68 corresponding to the second engaging section 66b of the engaging member 46 (please refer to FIG. 3).

Preferably, one of the base 44 and the operating member 48 is arranged with a longitudinal hole 76 configured to allow a portion of a shaft member 78 to pass through, in order to connect the operating member 48 to the base 44, such that the operating member 48 is movable relative to the base 44 within a limited range. Preferably, the shaft member 78 passes through the second part 60b of the supporting member 60, such that the base 44 is pivoted relative to the second part 60b of the supporting member 60.

Preferably, the cable management assembly 34 further comprises an elastic member 80 configured to provide an elastic force to the operating member 48, such that the operating member 48 can be driven to return to a first position P1 in response to the elastic force of the elastic member 80. For example, two ends of the elastic member 80 are respectively connected to the operating member 48 and the base 44. Preferably, the operating part 56 of the operating member 48 is extended beyond the second end 44b of the base 44 to be easily operated by a user.

Preferably, one of the guiding part 58 of the operating member 48 and the engaging member 46 has a protruded structure formed with an arc surface or an inclined surface. In the present embodiment, the guiding part 58 of the operating member 48 has the protruded structure formed with an inclined surface 58a, but the present invention is not limited thereto. The other one of the guiding part 58 of the operating member 48 and the engaging member 46 has a recessed part 49 extended with an abutting surface 82. In the present embodiment, the engaging member 46 has the recessed part 49 extended with the abutting surface 82, but the present invention is not limited thereto.

As shown in FIG. 8 to FIG. 11, the operating member 48 is configured to be operated through the operating part 56 to move from the first position P1 to a second position P2. The guiding part 58 is configured to guide the engaging member 46 in response to movement of the operating member 48 in order to move the engaging part 52 of the engaging member 46 away from the engaging position L1.

Specifically, when the operating part 56 of the operating member 48 is operated to move and when the guiding part 58 of the operating member 48 is moved in response to the operating member 48, the protruded structure of the guiding part 58 is moved away from the recessed part 49 of the engaging member 46 to abut against the abutting surface 82 (as shown in FIG. 11), such that the engaging part 52 of the engaging member 46 is moved away from the engaging position L1 to be located at a disengaging position L2, so as to disengage the engaging part 52 of the engaging member 46 from the connecting sections 55a of the connecting member 55 of the third rail 24. In other words, the supporting frame 40 can be detached from the connecting member 55 of the third rail 24 by moving the engaging part 52 of the engaging member 46 of the connecting device 42 to the disengaging position L2.

According to arrangement of the embodiment, the operating member 48 can be operated to move (longitudinally move), to further drive the engaging part 52 of the engaging member 46 to move away from the engaging position L1. Therefore, when the cable management assembly 34 of the present embodiment is mounted to the slide rail kit, the operating member 48 can be easily operated to detach the supporting frame 40 from the slide rail (such as the connecting member 55 of the third rail 24), in order to allow the user to make an adjustment based on a mounting environment.

Figure 14:
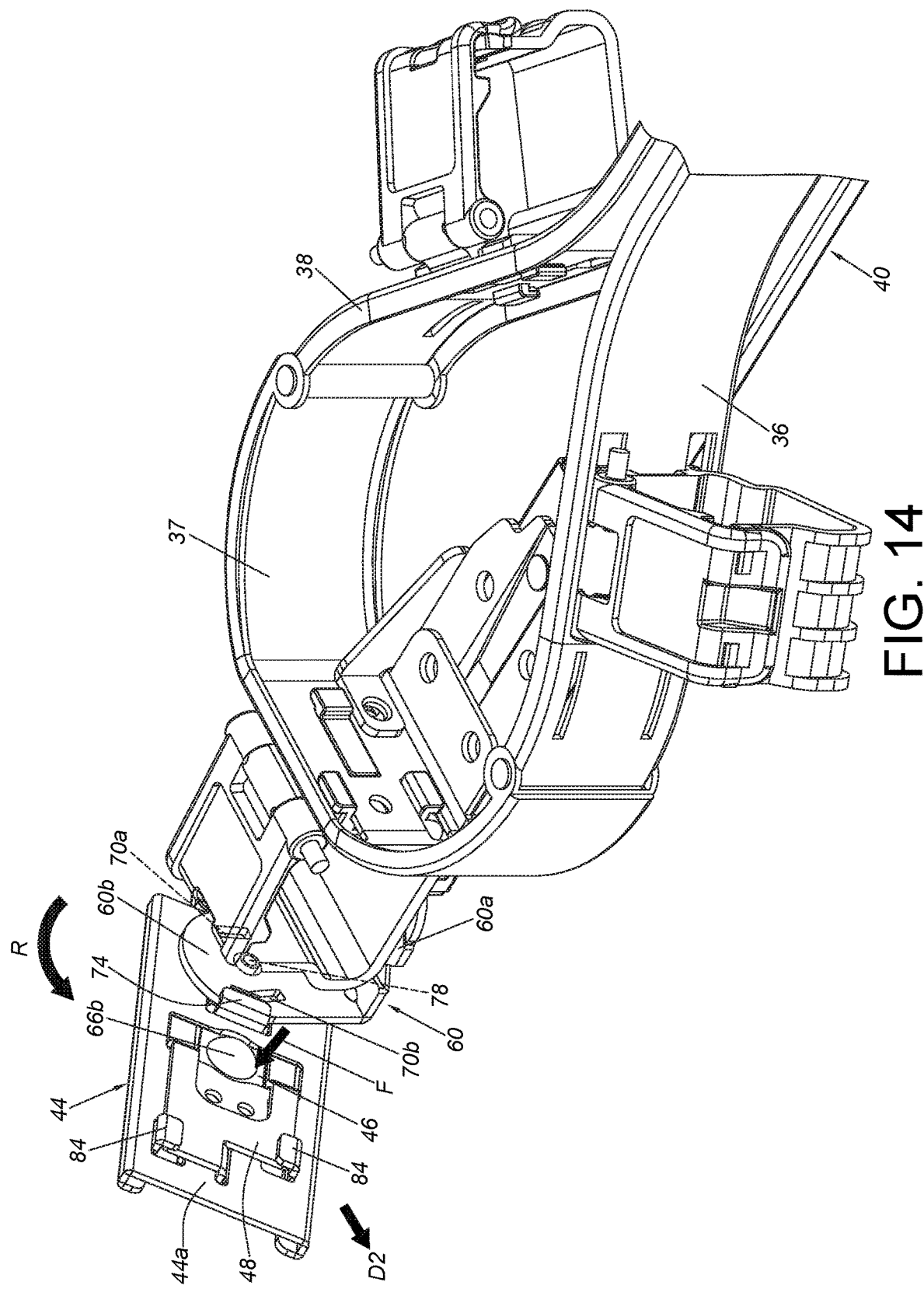
FIG. 14 is a diagram showing the base of the connecting device of the cable management assembly being operated to be no longer in the state according to an embodiment of the present invention.

As shown in FIG. 12 to FIG. 14, the second part 60b of the supporting member 60 comprises a first positioning feature 70a and a second positioning feature 70b. The second engaging section 66b of the engaging member 46 has a fastening part 72 configured to be selectively engaged with one of the first positioning feature 70a and the second positioning feature 70b (to abut against each other). For example, the fastening part 72 can be engaged with the first positioning feature 70a, in order to allow the first end 44a of the base 44 to extend in a first direction D1 (as shown in FIG. 12); or, when the base 44 is rotated along a rotary direction R around the shaft member 78 (as shown in FIG. 14) to move the fastening part 72 to be engaged with the second positioning feature 70b, the first end 44a of the base 44 is extended in a second direction D2 opposite to the first direction D1. According to such arrangement, the supporting frame 40 of the cable management assembly 34 can be adjusted in different directions based on the mounting environment.

Preferably, the base 44 has a first abutting part 74 configured to abut against an edge of the second part 60b of the supporting member 60. When the fastening part 72 of the engaging member 46 is operated by the user (such as applying a force F to press the second engaging section 66b of the engaging member 46) to move the fastening part 72 away from one of the first positioning feature 70a and the second positioning feature 70b of the supporting member 60, the first abutting part 74 is configured to abut against the edge of the second part 60b of the supporting member 60 to assist the base 44 in rotating relative to the supporting member 60 smoothly. In addition, the base 44 has a second abutting part 84 corresponding to the operating member 48 to assist the operating member 48 in moving along an operation direction stably.

Therefore, the cable management assembly according to the embodiments of the present invention is characterized in that:

1. The user can apply a force to the operating part 56 to longitudinally move the operating member 48 from the first position P1 to the second position P2. As such, the guiding part 58 guides the engaging member 46 in response to the movement of the operating member 48, such that the engaging part 52 of the engaging member 46 can be moved away from the engaging position L1. According to such arrangement which is different from the prior art, the operating part 56 of the cable management assembly can be operated within a narrow lateral space limited by the side plate 14 of the cabinet, such that the operating member 48 can drive the engaging part 52 of the engaging member 46 to move away from the engaging position L1 to detach the supporting frame 40 from the third rail 24.

2. The operating member 48 is configured to be held at the first position P1 in response to the elastic force of the elastic member 80.

3. The base 44 can be rotated to extend in different directions through the shaft member 78. According to such arrangement, the supporting frame 40 of the cable management assembly 34 can be adjusted to different directions based on the mounting environment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cable management assembly, comprising:
   a first cable management arm;
   a second cable management arm movably connected to the first cable management arm;
   a supporting frame configured to support at least one of the first cable management arm and the second cable management arm;
   a connecting device arranged on the supporting frame, the connecting device comprising:
      a base having a longitudinal body, the longitudinal body having a first end and a second end;
      an engaging member having an engaging part and an elastic part, wherein the engaging part is located adjacent to the first end of the base, and the engaging part is located at an engaging position in response to an elastic force of the elastic part; and
      an operating member having an operating part and a guiding part, wherein the operating part is located adjacent to the second end of the base, and the operating member is movable relative to the base along a longitudinal direction of the base;
   wherein the operating member is configured to be operated through the operating part to move relative to the base from a first position to a second position along the longitudinal direction of the base, and the guiding part is configured to be moved relative to the engaging member along the longitudinal direction of the base to abut against and guide the engaging member in response to movement of the operating member, in order to move the engaging part of the engaging member away from the engaging position.

2. The cable management assembly of claim 1, further comprising a supporting member having a first part and a second part substantially perpendicularly connected to the first part; wherein the supporting frame is connected to the first part of the supporting member, and the base of the connecting device is connected to the second part of the supporting member.

3. The cable management assembly of claim 2, wherein the engaging member further comprises a first engaging section, a second engaging section and a middle part connected between the first engaging section and the second engaging section, the engaging part is arranged on the first engaging section, the elastic part is connected between the engaging part and the middle part, the middle part is connected to the base of the connecting device, and the base of the connecting device has an opening corresponding to the second engaging section of the engaging member.

4. The cable management assembly of claim 3, wherein the second part of the supporting member comprises a first positioning feature and a second positioning feature, and the second engaging section of the engaging member has a fastening part configured to be selectively engaged with one of the first positioning feature and the second positioning feature, in order to allow the first end of the base of the connecting device to extend in a first direction or a second direction opposite to the first direction.

5. The cable management assembly of claim 4, wherein the base of the connecting device has a first abutting part configured to abut against an edge of the second part of the supporting member.

6. The cable management assembly of claim 2, wherein one of the base and the operating member of the connecting device is arranged with a longitudinal hole configured to allow a portion of a shaft member to pass through in order to connect the operating member to the base of the connecting device, such that the operating member is movable relative to the base of the connecting device within a limited range.

7. The cable management assembly of claim 6, wherein the base of the connecting device has a second abutting part corresponding to the operating member.

8. The cable management assembly of claim 7, further comprising an elastic member configured to provide an elastic force to the operating member, in order to drive the operating member to return to the first position.

9. The cable management assembly of claim 1, wherein one of the guiding part and the engaging member has a protruded structure formed with an arc surface or an inclined surface, and the other one of the guiding part and the engaging member has a recessed part extended with an abutting surface; wherein when the guiding part is moved in response to the operating member, the protruded structure is moved away from the recessed part to abut against the abutting surface in order to move the engaging part of the engaging member away from the engaging position.

10. The cable management assembly of claim 7, wherein the operating part of the operating member is extended beyond the second end of the base of the connecting device.

11. A cable management assembly of a slide rail kit, the slide rail kit comprising a first slide rail assembly and a second slide rail assembly, the first slide rail assembly comprising a first rail and a second rail movable relative to the first rail, and the second slide rail assembly comprising a third rail and a fourth rail movable relative to the third rail, wherein the third rail is arranged with a connecting member, the cable management assembly comprising:
   a first cable management arm detachably connected to the first rail of the first slide rail assembly;
   a second cable management arm movably connected to the first cable management arm, the second cable management arm being detachably connected to the second rail of the first slide rail assembly;

a supporting frame configured to support at least one of the first cable management arm and the second cable management arm; and a connecting device arranged on the supporting frame, the supporting frame being detachably connected to the third rail of the second slide rail assembly through the connecting device, the connecting device comprising:

a base having a longitudinal body, the longitudinal body having a first end and a second end;

an engaging member having an engaging part, wherein the engaging part is located adjacent to the first end of the base, the engaging part of the engaging member is configured to be engaged with the connecting member of the third rail when the engaging part of the engaging member is located at an engaging position; and an operating member having an operating part and a guiding part, wherein the operating part is located adjacent to the second end of the base, and the operating member is movable relative to the base along a longitudinal direction of the base;

wherein the operating member is configured to be operated through the operating part to move relative to the base from a first position to a second position along the longitudinal direction of the base, and the guiding part is configured to be moved relative to the engaging member along the longitudinal direction of the base to abut against and guide the engaging member in response to movement of the operating member, in order to move the engaging part of the engaging member away from the engaging position to detach the supporting frame from the third rail.

12. The cable management assembly of claim 11, further comprising a supporting member having a first part and a second part substantially perpendicularly connected to the first part; wherein the supporting frame is connected to the first part of the supporting member, and the base of the connecting device is connected to the second part of the supporting member.

13. The cable management assembly of claim 12, wherein the engaging member further comprises a first engaging section, a second engaging section, an elastic part and a middle part connected between the first engaging section and the second engaging section, the engaging part is arranged on the first engaging section, the elastic part is connected between the engaging part and the middle part, the middle part is connected to the base of the connecting device, and the base of the connecting device has an opening corresponding to the second engaging section of the engaging member.

14. The cable management assembly of claim 13, wherein the second part of the supporting member comprises a first positioning feature and a second positioning feature, and the second engaging section of the engaging member has a fastening part configured to be selectively engaged with one of the first positioning feature and the second positioning feature, in order to allow the first end of the base of the connecting device to extend in a first direction or a second direction opposite to the first direction.

15. The cable management assembly of claim 14, wherein the base of the connecting device has a first abutting part configured to abut against an edge of the second part of the supporting member.

16. The cable management assembly of claim 12, wherein one of the base and the operating member of the connecting device is arranged with a longitudinal hole configured to allow a portion of a shaft member to pass through in order to connect the operating member to the base of the connecting device, such that the operating member is movable relative to the base of the connecting device within a limited range.

17. The cable management assembly of claim 16, wherein the base of the connecting device has a second abutting part corresponding to the operating member.

18. The cable management assembly of claim 17, further comprising an elastic member configured to provide an elastic force to the operating member, in order to drive the operating member to return to the first position.

19. The cable management assembly of claim 11, wherein one of the guiding part and the engaging member has a protruded structure formed with an arc surface or an inclined surface, and the other one of the guiding part and the engaging member has a recessed part extended with an abutting surface; wherein when the guiding part is moved in response to the operating member, the protruded structure is moved away from the recessed part to abut against the abutting surface in order to move the engaging part of the engaging member away from the engaging position.

20. The cable management assembly of claim 17, wherein the operating part of the operating member is extended beyond the second end of the connecting device.

* * * * *